US008598002B2

(12) United States Patent
Xu et al.

(10) Patent No.: US 8,598,002 B2
(45) Date of Patent: Dec. 3, 2013

(54) METHOD FOR MANUFACTURING METAL GATE STACK STRUCTURE IN GATE-FIRST PROCESS

(75) Inventors: Qiuxia Xu, Beijing (CN); Yongliang Li, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 308 days.

(21) Appl. No.: 13/129,584

(22) PCT Filed: Feb. 17, 2011

(86) PCT No.: PCT/CN2011/071055
§ 371 (c)(1),
(2), (4) Date: May 17, 2011

(87) PCT Pub. No.: WO2011/153843
PCT Pub. Date: Dec. 15, 2011

(65) Prior Publication Data
US 2012/0003827 A1  Jan. 5, 2012

(30) Foreign Application Priority Data

Jun. 8, 2010  (CN) .......................... 2010 1 0199969

(51) Int. Cl.
*H01L 21/00* (2006.01)
(52) U.S. Cl.
USPC .......................................... 438/287; 438/592
(58) Field of Classification Search
USPC ........................................ 438/585–595, 287
See application file for complete search history.

(56) References Cited

U.S. PATENT DOCUMENTS

| 5,294,571 | A  | * | 3/1994 | Fujishiro et al. | 438/770 |
| 6,271,094 | B1 | * | 8/2001 | Boyd et al. | 438/287 |
| 7,186,661 | B2 |   | 3/2007 | Puppo et al. | 438/713 |
| 7,189,652 | B1 | * | 3/2007 | Blosse et al. | 438/696 |

(Continued)

FOREIGN PATENT DOCUMENTS

| CN | 1404113 | 3/2003 |
| CN | 1404113 A | 3/2003 |

(Continued)

OTHER PUBLICATIONS

Chinese Office Action from corresponding Chinese Application No. CN201010199969.8, dated Aug. 3, 2012.

(Continued)

*Primary Examiner* — Richard Booth
(74) *Attorney, Agent, or Firm* — Westman, Champlin & Koehler, P.A.

(57) ABSTRACT

A method for manufacturing a metal gate stack structure in gate-first process comprises the following steps after making conventional LOCOS and STI isolations: growing an untra-thin interface layer of oxide or oxynitride on a semiconductor substrate by rapid thermal oxidation or chemical process; depositing a high dielectric constant (K) gate dielectric on the untra-thin interface oxide layer and then performing rapid thermal annealing; depositing a TiN metal gate; depositing a barrier layer of AlN or TaN; depositing a poly-silicon film and a hard mask, and performing photo-lithography and the etching of the hard mask; after photo-resist removing, etching the poly-silicon film/metal gate/high-K gate dielectric sequentially to form the metal gate stack structure. The manufacturing method of the present invention is suitable for integration of high-K dielectric/metal gate in nano-scale CMOS devices, and removes obstacles of implementing high-K/metal gate integration.

9 Claims, 1 Drawing Sheet

(56) References Cited

U.S. PATENT DOCUMENTS

| | | | |
|---|---|---|---|
| 8,138,076 B2 * | 3/2012 | Lin et al. | 438/591 |
| 8,183,161 B2 | 5/2012 | Fernandez et al. | 438/714 |
| 2008/0188044 A1 | 8/2008 | Hsu et al. | 438/211 |
| 2009/0280632 A1 | 11/2009 | Lin et al. | 438/588 |
| 2010/0078733 A1 | 4/2010 | Masuoka et al. | 257/384 |

FOREIGN PATENT DOCUMENTS

| | | |
|---|---|---|
| CN | 1781185 A | 5/2006 |
| CN | 101511969 A | 8/2009 |
| CN | 101533842 | 9/2009 |
| CN | 101582379 A | 11/2009 |
| CN | 10168578 | 3/2010 |
| CN | 101685780 A | 3/2010 |

OTHER PUBLICATIONS

Translation of Chinese Office Action from corresponding Chinese Application No. CN201010199969.8, dated Aug. 3, 2012.

Second Office Action and English translation from corresponding Chinese Application No. 201010199969.8, dated Feb. 21, 2013 (8 pages).

"Latest Development of Integration of high-k/Dual Metal Gate in Gate First Process" Yongliang et al., vol. 39, No. 6, Dec. 2009; 6 pages.

International Search Report and Written Opinion of International Search Report in Chinese for PCT/CN2011/071055 filed Feb. 2011; 13 pages.

* cited by examiner

METHOD FOR MANUFACTURING METAL GATE STACK STRUCTURE IN GATE-FIRST PROCESS

CROSS-REFERENCE TO RELATED APPLICATION

This Application is a Section 371 National Stage Application of International Application No. PCT/CN2011/071055, filed Feb. 17, 2011, not yet published, which claims priority to CN 201010199969.8, filed on Jun. 8, 2010, the contents of which are hereby incorporated by reference in their entirety.

FIELD OF THE INVENTION

The present invention relates to a method for manufacturing a metal gate stack structure in a gate-first process, and particularly to a method for manufacturing a TiN metal gate stack structure with a barrier layer of AlN or TaN in the gate-first process. The present invention is applicable to high-performance nano-scale Complementary Metal Oxide Semiconductor (CMOS) devices for the technology generations of 32/22 nanometers or below.

BACKGROUND

As the feature size of CMOS devices is continuously reducing, the application of a gate dielectric with a high dielectric constant (K) and a metal gate electrode has become an inevitable trend. The high-K dielectric has a thicker physical thickness for a given Equivalent Oxide Thickness (EOT), by which it is possible to greatly reduce the gate tunneling leakage current. However, the conventional polysilicon gate is incompatible with the high-K gate dielectric due to the sever Fermi Pinning Effect, so it must be replaced with the novel metal gate electrode. With the metal gate, it is possible not only to avoid the depletion effect of the polysilicon gate and to reduce the gate resistance, but also to avoid the boron penetration, so as to improve the device reliability. However, there are still some problems to be addressed in integrating the metal gate on the high-K gate dielectric, such as problems of thermal stability and interface state. In particular, the Fermi Pinning Effect imposes a great challenge on obtaining of a properly low threshold voltage required by the nano-scale CMOS devices, especially PMOS devices.

In order to obtain a proper threshold, work functions of an N-type transistor and a P-type transistor should be in the proximity of the bottom of a conduction band of Si (about 4.1 eV) and in the proximity of top of a valence band of Si (about 5.2 eV), respectively. A TiN metal gate has become a promising candidate for the metal gate due to its low resistivity and excellent thermal and chemical stability. In the integration technology, in order to reduce the difficulty of etching and to increase as less as possible the complexity of the existing CMOS process, an inserted metal gate stack structure (i.e. a polysilicon/metal gate stack structure) is usually used instead of a pure metal gate to implement the integration of the high-K and metal gate materials. However, since the high-temperature process in directly depositing a polysilicon layer on the TiN metal gate will cause reaction between the TiN metal gate and the polysilicon layer, this has become an obstacle of the metal gate/high-K integration technology.

SUMMARY OF THE INVENTION

An object of the present invention is to provide a method for manufacturing a metal gate stack structure in gate-first process. A metal nitride layer of AlN or TaN having a high thermal stability is inserted as a barrier layer between a TiN metal gate and a polysilicon layer, in order to improve thermal stability. Meanwhile, high-density plasma etching using the mixed gas of $BCl_3/Cl_2/O_2/Ar$ under a low-pressure and reverse bias condition reduces the difficulty of etching the TiN metal gate stack structure with the barrier layer of AlN or TaN, and obtains a vertical and continuous etching profile. There is also a high etching selectivity with respect to the Si substrate. Thus, it is possible to remove the obstacles of implementing metal gate/high-K integration.

In order to achieve the above object, according to an aspect of the invention, there is provided a method for manufacturing a metal gate stack structure in a gate-first process, mainly comprising:

Step 1) forming an interface layer of SiOx or SiON by rapid thermal annealing at 600-800° C. for 20-120 s or by chemical processing with $O_3$, after making conventional LOCOS or STI isolations;

Step 2) depositing a high-K gate dielectric film;

Step 3) thermal annealing at 600-1050° C. for 4-120 s after the high-K gate dielectric film is deposited;

Step 4) forming a metal gate electrode by depositing a TiN gate by Physical Vapor Deposition;

Step 5) depositing a barrier layer of AlN or TaN by Physical Vapor Deposition;

Step 6) depositing a polysilicon film and a hard mask by low-pressure Chemical Vapor Deposition, and then performing photolithography and etching the hard mask; and Step 7) etching the polysilicon film/AlN or TaN barrier layer/TiN metal gate/high-K gate dielectric film sequentially by using the etched hard mask as a mask, to form the metal gate stack structure.

In the method, before step 1), the substrate is cleaned in a conventional way and then immersed in a mixed solution of hydrofluoric acid/isopropyl alcohol/water at the room temperature, rinsed with deionized water; and placed into the furnace immediately after spin-drying, wherein the ratio of hydrofluoric acid:isopropyl alcohol:water in volume is: 0.2-1.5%:0.01-0.10%:1%, and the immersion is performed for 2-10 minutes.

In the method, in step 1), the interface layer is formed by implanting nitrogen and then performing rapid thermal annealing; or by forming SiOx by rapid thermal annealing and then forming SiON by nitridation; or by forming SiOx by chemical processing with $O_3$, which then is subjected to plasma nitridation.

In the method, in step 2), the high-K gate dielectric film comprises $HfO_2$, HfAlO, HfAlON, HfSiO, HfSiON, HfLaO, or HfLaON. The high-K gate dielectric film is formed by Physical Vapor Deposition, Metal Organic Chemical Vapor Deposition, or Atom Layer Deposition.

In the method, in step 4), the thickness of the TiN metal gate is 5-100 nm.

In the method, in step 5), the thickness of the AlN or TaN barrier layer is 2-12 nm.

In the method, in step 6), the hard mask is $SiO_2$(O), $Si_3N_4$ (N), or a stack thereof: O/N or O/N/O; and the hard mask is etched by F-based plasma.

In the method, in step 7), the polysilicon is etched by F based plasma+Cl based plasma or HBr+Cl based plasma. The plasma etching of the AlN or TaN barrier metal layer, the TiN metal gate and the high-K gate dielectric film is performed by using $BCl_3$ and $Cl_2$ as main etching gases with one or both of $O_2$ and Ar added as supplementary etching gases to improve etching characteristics.

In the method, in step 7), the ratio of the main etching gases $Cl_2$ and $BCl_3$ in volume is 0-1:4; the ratio of the added gas $O_2$ and $BCl_3$ in volume is 0-1:8; and the ratio of the added gas Ar and $BCl_3$ in volume is 1:5-1:2.

In the method, in step 7), the AlN or TaN barrier layer/TiN metal gate/high-K gate dielectric film are etched under such a condition that the power of an upper electrode is 140-450 W, the power of an lower electrode is 50-150 W, a pressure is 4-15 mt, the total flow rate of the $BCl_3$ based etching gas is 60-150 sccm, and the temperature of the chamber and the electrodes is controlled to be 60-200° C.

The present invention has the following three advantages.
1) According to the method for manufacturing the TiN metal gate stack structure with the barrier layer of AlN or TaN in the gate-first process according to the present invention, the complexity of etching process is not increased due to the addition of the AlN or TaN barrier layer on the TiN metal gate, and the etching of the barrier layer and the TiN metal gate is completed by one step.
2) According to the method for manufacturing the TiN metal gate stack structure with the barrier layer of AlN or TaN in the gate-first process according to the present invention, it is possible to obtain a vertical etching profile and to reduce the loss of the Si substrate, so that the requirement on the etching process in the case where the high-K and metal gate materials are induced in the integration process can be satisfied.
3) The method for manufacturing the TiN metal gate stack structure with the barrier layer of AlN or TaN in the gate-first process according to the present invention is completely compatible with the existing CMOS process.

Therefore, the method for manufacturing the TIN metal gate stack structure with the barrier layer of AlN or TaN in the gate-first process according to the present invention is suitable for integration of high-K dielectric/metal gate in nano-scale CMOS devices, and removes obstacles of implementing metal gate/high-K integration.

DETAILED DESCRIPTION OF THE PREFERRED EMBODIMENTS

Figure 1A:
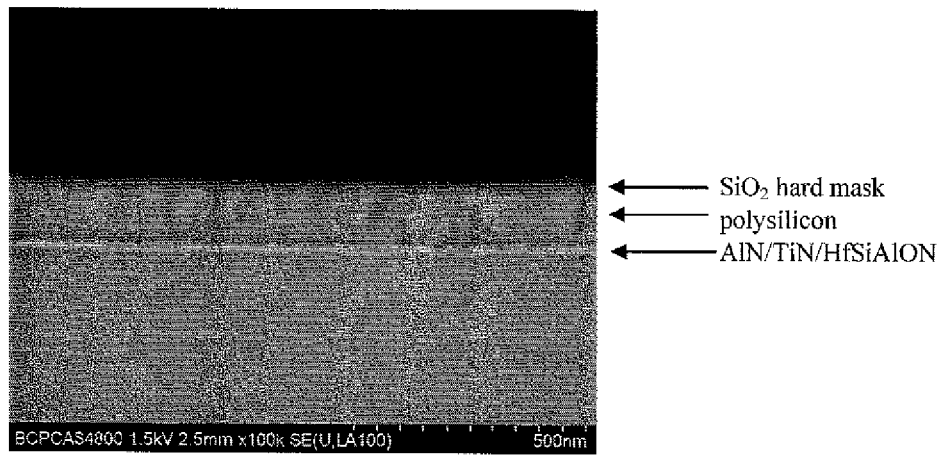
FIG. 1(a) is a photograph of a stack structure of $SiO_2$ hard mask/polysilicon/AlN barrier layer/TIN metal gate/high-K dielectric/interface $SiO_2$ taken by a scanning electron microscope.

According to the present invention, there is provided a method for manufacturing a TiN metal gate stack structure with a barrier layer of AlN or TaN in a gate-first process, in order to incorporate the new technology of high-K/metal gate in manufacturing nano-scale CMOS devices.

According to the present invention, the method comprises the following steps:
Step 1) cleaning: cleaning a substrate after device isolations are formed thereon but before an interface oxide layer is formed thereon, wherein the substrate is cleaned in a conventional way and then immersed in a mixed solution of hydrofluoric acid/isopropyl alcohol/water at the room temperature, rinsed with deionized water; and placed into a furnace immediately after spin-drying, and wherein the ratio of hydrofluoric acid:isopropyl alcohol:water in volume is: 0.2-1.5%:0.01-0.10%:1%.
Step 2) forming an interface layer of SiOx or SiON: forming the interface layer by rapid thermal annealing for 20-120 s at 600-800° C., or by chemical processing with $O_3$.
Step 3) forming a high-K gate dielectric film: wherein the high-K gate dielectric film may be $HfO_2$, HfAlO, HfAlON, HfSiO, HfSiON, HfLaO, or HfLaON, etc., and is formed by Physical Vapor Deposition, Metal Organic Chemical Vapor Deposition, or Atom Layer Deposition.
Step 4) rapid thermal annealing after depositing the high-K dielectric: thermal annealing for 4-120 s at 600-1050° C.
Step 5) forming a metal gate electrode: depositing a TiN gate with a thickness of 5-100 nm by Physical Vapor Deposition.
Step 6) depositing a barrier layer of AlN or TaN with a thickness of 5-12 nm by Physical Vapor Deposition.
Step 7) depositing a poly-silicon film and a hard mask by low-pressure Chemical Vapor Deposition, and then performing photolithography and the etching of the hard mask, wherein the hard mask may be formed of $SiO_2$ (O), $Si_3N_4$ (N), or a stack thereof: O/N or O/N/O, and the hard mask is etched by F-based plasma.
Step 8) after photo-resist removing, etching the polysilicon film/barrier metal layer/metal gate/high-K gate dielectric sequentially by using the etched hard mask as a mask, to form the metal gate stack structure, wherein the polysilicon is etched by F based plasma+Cl based plasma or HBr+Cl based plasma, and the high-density plasma etching of the AlN or TaN barrier layer, the TiN metal gate and the high-K gate dielectric is performed by using $BCl_3$ and $Cl_2$ as main etching gases with one or both of $O_2$ and Ar added as supplementary etching gases to improve etching characteristics.

The present invention is further explained in conjunction with an embodiment.
Step 1) cleaning: cleaning a substrate after device isolations are formed thereon but before an interface oxide layer is formed thereon, wherein the substrate is cleaned in a conventional way and then immersed in a mixed solution of hydrofluoric acid/isopropyl alcohol/water at the room temperature for 5 minutes, rinsed with deionized water; and placed into a furnace immediately after spin-drying, and wherein the concentration ratio of hydrofluoric acid in volume: isopropyl alcohol:water is: 0.2-1.5%:0.01-0.10%:1%.
Step 2) forming an interface layer of SiOx or SiON: forming the interface layer by rapid thermal annealing for 30-120 s at 600-800° C.
Step 3) forming a high-K gate dielectric film with HfSiON, HfSiAlON, or HfLaON, etc., by Physical Vapor Deposition.
Step 4) rapid thermal annealing after depositing the high-K dielectric: thermal annealing for 4-60 s at 600-1050° C.
Step 5) forming a metal gate electrode: depositing a TiN gate with a thickness of 10-50 nm by Magnetron Reactive Sputtering.
Step 6) depositing a barrier layer of AlN or TaN with a thickness of 5-12 nm by Magnetron Reactive Sputtering.
Step 7) depositing a polysilicon film and a hard mask by low-pressure Chemical Vapor Deposition, and then performing photolithography and etching the hard mask, wherein the hard mask is $SiO_2$, and the hard mask is etched by F-based plasma.
Step 8) after photo-resist removing, etching the poly-silicon film/barrier metal layer/metal gate/high-K gate dielectric sequentially by using the etched hard mask as a mask, to form the metal gate stack structure, wherein the poly-silicon is etched by HBr+Cl based plasma, and the high-density plasma etching of the AlN or TaN barrier layer, the TiN metal gate and the high-K gate dielectric is performed by using $BCl_3$ and $Cl_2$ as main etching gases with one or both of $O_2$ and Ar added as supplementary etching gases to improve etching characteristics.

Figure 1B:
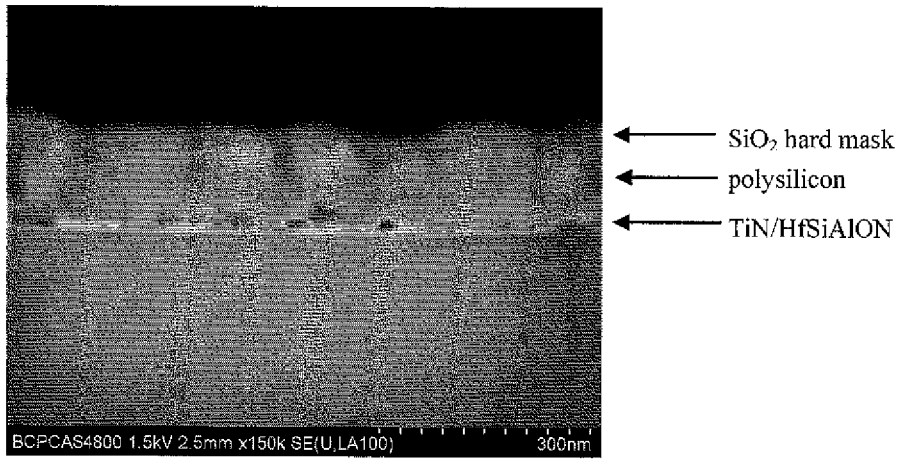
FIG. 1(b) shows a structure without the AlN barrier layer.

FIG. 1(a) shows a stack structure of $SiO_2$ hard mask/poly-silicon/AlN barrier layer/TiN metal gate/high-K dielectric/interface $SiO_2$ manufactured according to the embodiment of the present invention. FIG. 1(b) shows a structure without the AlN barrier layer. A comparison between FIG. 1(a) and FIG. 1(b) clearly shows that there is an obvious interface reaction at the interface of poly-silicon/TiN in the case of FIG. 1(b), while there is no interface reaction due to the AlN barrier layer in the case of FIG. 1(a) and thus the interface is flat.

Figure 2:
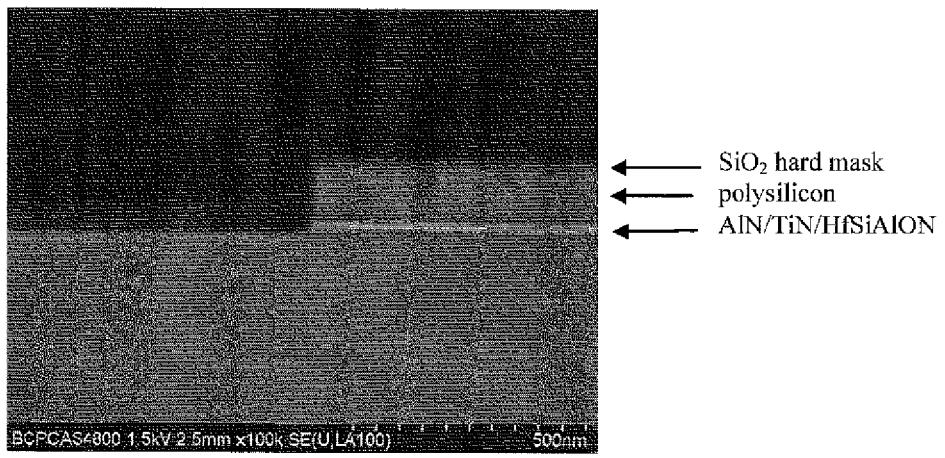
FIG. 2 shows a vertical and continuous etching profile of a gate stack structure of $SiO_2$ hard mask/polysilicon/AlN or TaN barrier layer/TIN metal gate/high-K dielectric/interface $SiO_2$ which is obtained by high-density plasma etching with $BCl_3/Cl_2/O_2$/Ar mixed gases under a low-pressure and reversed bias condition.

FIG. 2 shows that a vertical and continuous etching profile of the stack structure of $SiO_2$ hard mask/poly-silicon/AlN or TaN barrier layer/TIN metal gate/high-K dielectric/interface $SiO_2$ is obtained by high-density plasma etching with $BCl_3/Cl_2/O_2/Ar$ mixed gases under a low-pressure and reversed bias condition. There is no Si loss, indicating a high etching selectivity with respect to the Si substrate.

The above are preferable embodiments of the present invention, which are not intended to limit the invention. Any modifications, equivalent replacements or improvements made without departing from the spirit and principle of the present invention all fall into the scope of the present invention.

What is claimed is:

1. A method for manufacturing a metal gate stack structure in gate-first process, comprising:

Step 1) forming an interface layer of SiOx or SiON by rapid thermal annealing at 600-800° C. for 20-120 s or by chemical processing with $O_3$, after making conventional LOCOS or STI isolations;

Step 2) depositing a high-K gate dielectric film;

Step 3) thermal annealing at 600-1050° C. for 4-120 s after the high-K gate dielectric film is deposited;

Step 4) forming a metal gate electrode by depositing a TiN gate by Physical Vapor Deposition;

Step 5) depositing a barrier layer of AlN or TaN by Physical Vapor Deposition;

Step 6) depositing a poly-silicon film and a hard mask by low-pressure Chemical Vapor Deposition, and then performing photo-lithography and the etching of the hard mask; and Step 7) etching the poly-silicon film/AlN or TaN barrier layer/TiN metal gate/high-K gate dielectric film sequentially by using the etched hard mask as a mask, to form the metal gate stack structure, wherein the poly-silicon is etched by F based plasma+Cl based plasma or HBr+Cl based plasma; the plasma etching of the Aln or TaN barrier metal layer, the TiN metal gate and the high-K gate dielectric film is performed by using $BGl_3$ and Cl, as main etching gases with one or both of $O_2$ and Ar added as supplementary etching gases to improve etching characteristics.

2. The method according to claim 1, wherein before step 1), the substrate is cleaned in a conventional way and then immersed in a mixed solution of hydrofluoric acid/isopropyl alcohol/water at the room temperature, rinsed with deionized water; and placed into the furnace immediately after spin-drying, and wherein the ratio of hydrofluoric acid:isopropyl alcohol:water in volume is: 0.2-1.5%:0.01-0.10%:1%, and the immersion is performed for 2-10 minutes.

3. The method according to claim 1, wherein in step 1), the interface layer is formed by implanting nitrogen and then performing rapid thermal annealing; or by forming SiOx by rapid thermal annealing and then forming SiON by nitridation; or by forming SiOx by chemical processing with $O_3$, which then is subjected to plasma nitridation.

4. The method according to claim 1, wherein in step 2), the high-K gate dielectric film comprises $HfO_2$, HfAlO, HfAlON, HfSiO, HfSiON, HfLaO, or HfLaON, and the high-K gate dielectric film is formed by Physical Vapor Deposition, Metal Organic Chemical Vapor Deposition, or Atom Layer Deposition.

5. The method according to claim 1, wherein in step 4), the thickness of the TiN metal gate is 5-100 nm.

6. The method according to claim 1, wherein in step 5), the thickness of the AlN or TaN barrier layer is 2-12 nm.

7. The method according to claim 1, wherein in step 6), the hard mask is $SiO_2$, $Si_3N_4$ or a stack thereof: $SiO_2/Si_3N_4$ or $SiO_2/Si_3N_4/SiO_2$; and the hard mask is etched by F-based plasma.

8. The method according to claim 1, wherein the ratio of the main etching gases $Cl_2$ and $BCl_3$ in volume is 0-1:4; the ratio of the added gas $O_2$ and $BCl_3$ in volume is 0-1:8; and the ratio of the added gas Ar and $BCl_3$ in volume is 1:5-1:2.

9. The method according to claim 1, wherein in step 7), the MN or TaN barrier layer/TiN metal gate/high-K gate dielectric film are etched under such a condition that the power of an upper electrode is 140-450 W, the power of an lower electrode is 50-150 W, a pressure is 4-15 mt, the total flow rate of the $BCl_3$ based etching gas is 60-150 sccm, and the temperature of the chamber and the electrodes is controlled to be 60-200° C.

* * * * *